(12) United States Patent
Elian

(10) Patent No.: US 9,121,880 B2
(45) Date of Patent: Sep. 1, 2015

(54) MAGNETIC SENSOR DEVICE

(75) Inventor: Klaus Elian, Alteglofsheim (DE)

(73) Assignee: Infineon Technologies AG, Neubiberg (DE)

( * ) Notice: Subject to any disclaimer, the term of this patent is extended or adjusted under 35 U.S.C. 154(b) by 669 days.

(21) Appl. No.: 13/289,629

(22) Filed: Nov. 4, 2011

(65) Prior Publication Data

US 2013/0113474 A1     May 9, 2013

(51) Int. Cl.
| | |
|---|---|
| *G01R 33/02* | (2006.01) |
| *G01R 33/00* | (2006.01) |
| *H01L 43/02* | (2006.01) |
| *H01F 1/113* | (2006.01) |
| *H01F 1/08* | (2006.01) |

(52) U.S. Cl.
CPC ............ *G01R 33/0047* (2013.01); *H01L 43/02* (2013.01); *H01F 1/083* (2013.01); *H01F 1/113* (2013.01); *Y10T 29/4902* (2015.01)

(58) Field of Classification Search
CPC ..... G01R 33/02; G01R 33/06; G01R 33/0047
USPC ............... 324/244, 219, 260, 207.23, 207.24, 324/207.25, 173, 174, 207.2, 207.21
See application file for complete search history.

(56) References Cited

U.S. PATENT DOCUMENTS

| | | | | |
|---|---|---|---|---|
| 4,743,786 | A | * | 5/1988 | Ichikawa et al. ............... 310/111 |
| 4,899,104 | A | * | 2/1990 | Maelzer et al. ........... 324/750.25 |
| 4,945,634 | A | * | 8/1990 | Kumada ........................... 29/854 |
| 5,210,493 | A | * | 5/1993 | Schroeder et al. ............. 324/252 |
| 5,508,611 | A | * | 4/1996 | Schroeder et al. ............. 324/252 |
| 5,581,179 | A | * | 12/1996 | Engel et al. ................. 324/207.2 |
| 5,963,028 | A | * | 10/1999 | Engel et al. ................. 324/207.2 |
| 6,175,229 | B1 | | 1/2001 | Becker et al. |
| 6,505,513 | B1 | * | 1/2003 | Linke et al. ................ 73/514.29 |
| 6,933,716 | B2 | | 8/2005 | Stettler et al. |
| 7,385,394 | B2 | * | 6/2008 | Auburger et al. ............. 324/252 |
| 2003/0183954 | A1 | | 10/2003 | Wolf |
| 2004/0080046 | A1 | * | 4/2004 | Choon Kuan et al. ........ 257/738 |
| 2006/0038560 | A1 | | 2/2006 | Kurumado |
| 2007/0018642 | A1 | | 1/2007 | Ao |
| 2007/0075705 | A1 | * | 4/2007 | Kurumado ............... 324/207.25 |
| 2007/0120555 | A1 | * | 5/2007 | Tokuhara ................. 324/207.21 |
| 2007/0145972 | A1 | | 6/2007 | Auburger et al. |
| 2007/0164734 | A1 | | 7/2007 | Shimizu et al. |
| 2007/0188277 | A1 | * | 8/2007 | Ries .................................. 335/78 |
| 2007/0205094 | A1 | | 9/2007 | Pavan et al. |

(Continued)

FOREIGN PATENT DOCUMENTS

| | | |
|---|---|---|
| CN | 1737503 A | 2/2006 |
| CN | 101617243 A | 12/2009 |

(Continued)

OTHER PUBLICATIONS

Hung, Y.C., et al., "Effects of Additives on the Orientation and Strength of Plastic Ferrite Magnet," IEEE Transactions on Magnetics, Sep. 1989, pp. 3287-3289, vol. 25, No. 5.

*Primary Examiner* — Patrick Assouad
*Assistant Examiner* — Lamarr Brown
(74) *Attorney, Agent, or Firm* — Slater & Matsil, L.L.P.

(57) ABSTRACT

A magnetic sensor device includes a magnet configured to generate a bias magnetic field. A plurality of electrical wires extend through the magnet. A magnetic sensor chip is attached to an end face of a first electrical wire of the plurality of electrical wires.

22 Claims, 11 Drawing Sheets

(56) References Cited

U.S. PATENT DOCUMENTS

| | | | |
|---|---|---|---|
| 2007/0241423 A1* | 10/2007 | Taylor et al. | 257/530 |
| 2007/0247144 A1* | 10/2007 | Tokuhara et al. | 324/207.25 |
| 2008/0061768 A1* | 3/2008 | Kurumdo | 324/207.21 |
| 2009/0065912 A1* | 3/2009 | Riedl et al. | 257/666 |
| 2009/0096441 A1 | 4/2009 | Masuda | |
| 2009/0140724 A1* | 6/2009 | Kentsch | 324/202 |
| 2009/0140725 A1 | 6/2009 | Ausserlechner | |
| 2009/0243595 A1 | 10/2009 | Theuss et al. | |
| 2010/0117171 A1 | 5/2010 | Hesen et al. | |
| 2010/0201356 A1* | 8/2010 | Koller et al. | 324/252 |
| 2010/0330708 A1 | 12/2010 | Engel et al. | |
| 2011/0127998 A1* | 6/2011 | Elian et al. | 324/219 |
| 2011/0133732 A1 | 6/2011 | Sauber | |
| 2011/0209894 A1* | 9/2011 | Williams et al. | 174/107 |
| 2012/0038352 A1* | 2/2012 | Elian et al. | 324/239 |
| 2012/0086444 A1* | 4/2012 | Chen et al. | 324/251 |

FOREIGN PATENT DOCUMENTS

| | | |
|---|---|---|
| CN | 101656242 A | 2/2010 |
| CN | 101681894 A | 3/2010 |
| DE | 102008058895 A1 | 6/2009 |
| DE | 102009013510 A1 | 10/2009 |
| JP | 979865 A | 3/1997 |
| JP | 9166612 A | 6/1997 |

* cited by examiner

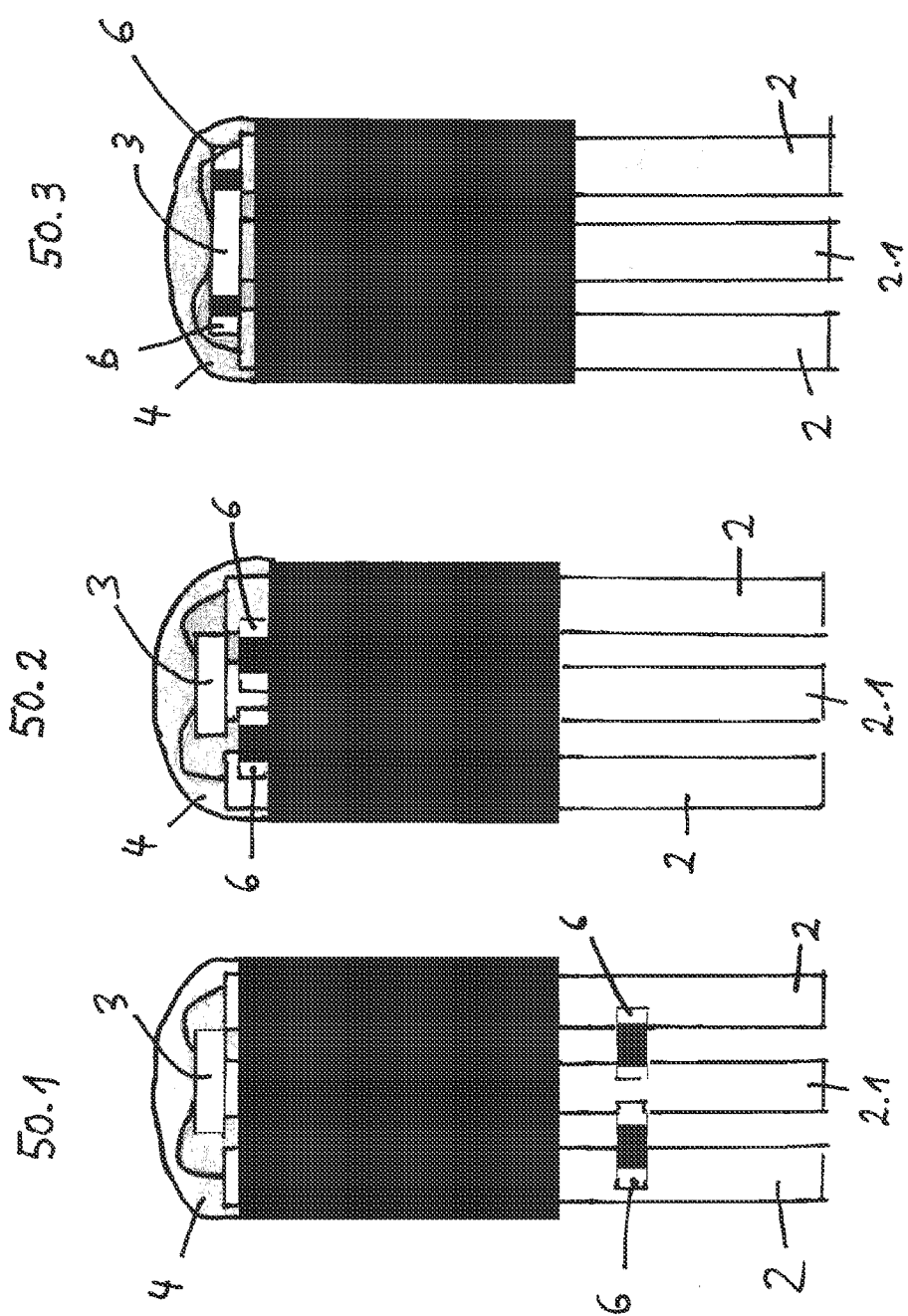

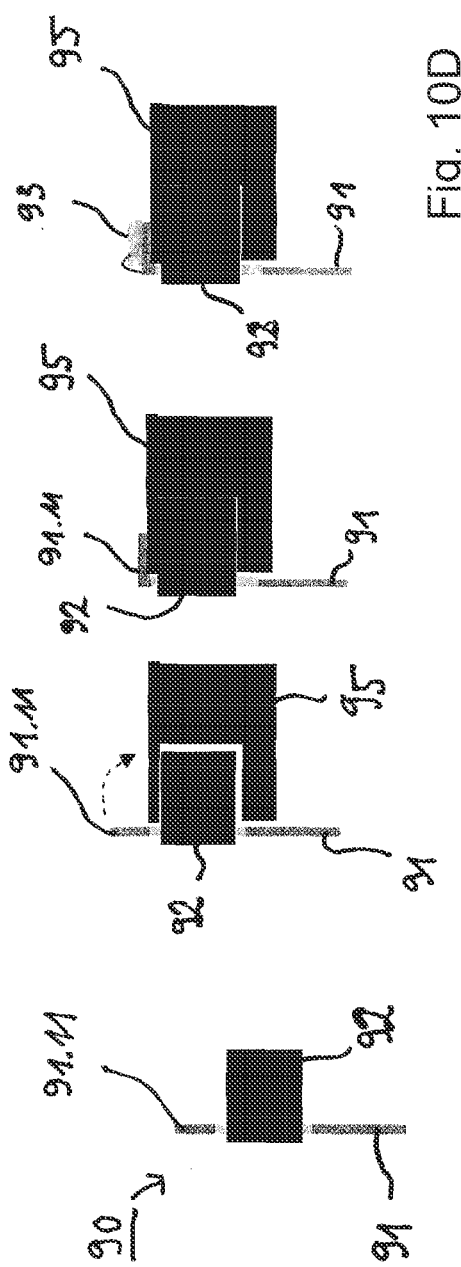

MAGNETIC SENSOR DEVICE

TECHNICAL FIELD

The present invention relates to a magnetic sensor device and a method for fabricating a magnetic sensor device.

BACKGROUND

Magnetic sensor devices can, for example, be configured to measure the speed of a magnetic tooth wheel. Such magnetic speed sensors typically include an integrated circuit with a plurality of magnetic sensor elements, such as Hall sensor elements or magneto resistive (XMR) elements, as, for example, giant magneto resistive (GMR) sensor elements or anisotrope magneto resistive (AMR) sensor elements. A permanent magnet provides a bias magnetic field to the sensor elements. As the wheel is rotated, the teeth of the wheel pass in front of the sensor and generate a small field variation, which is detected by the sensor and processed by the integrated circuit. The detected field contains information about the angular position and rotational speed of the wheel. With respect to the fabrication of such magnetic sensor devices there is a steady demand towards reducing or simplifying fabrication steps, in particular reducing pick-and-place steps or mold steps. Another steady demand relates to the size of the magnetic sensor device package and to the variability of the shape of the permanent magnet as it can be desirable to provide the permanent magnet with a specific shape so as to provide the permanent magnetic field with a particular desired field distribution.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 5A-5C show schematic cross-sectional side view representations of magnetic sensor devices according to embodiments;

FIGS. 10A-10E show schematic cross-sectional side view representations of a method step for obtaining an intermediate product as shown in FIG. 9C according to an embodiment.

DETAILED DESCRIPTION OF ILLUSTRATIVE EMBODIMENTS

Figure 1:
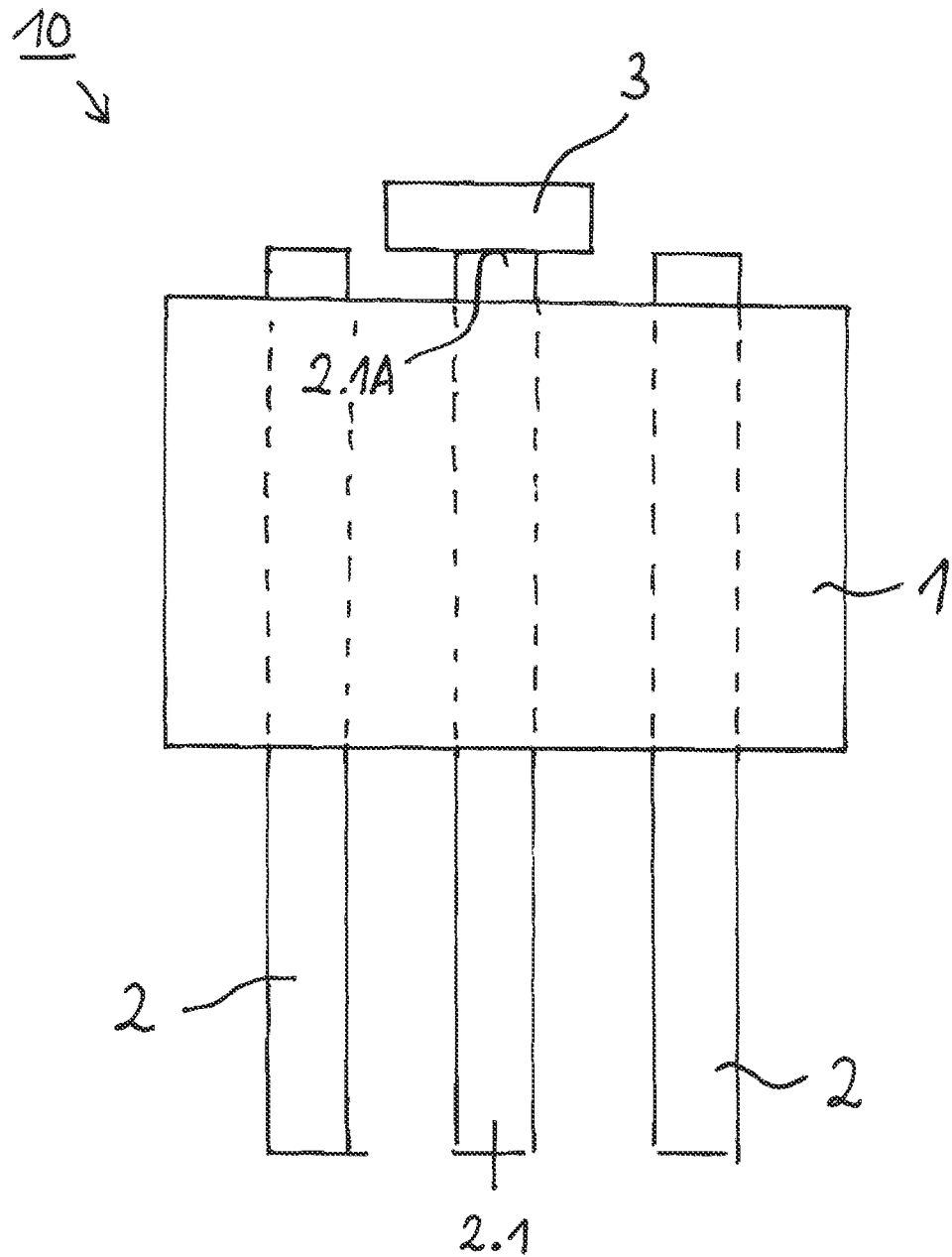
FIG. 1 shows a schematic cross-sectional side view representation of a magnetic sensor device according to an embodiment.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

In several embodiments layers or layer stacks are applied to one another or materials are applied or deposited onto layers or other substrates. It should be appreciated that any such terms as "applied" or "deposited" are meant to cover literally all kinds and techniques of applying layers or materials onto substrates. In particular, they are meant to cover techniques in which layers or materials are applied at once as a whole like, for example, laminating techniques as well as techniques in which layers or materials are deposited in a sequential manner like, for example, sputtering, plating, molding, CVD, etc.

Embodiments as described herein comprise magnetic sensor chips. The magnetic sensor chips may comprise contact elements or contact pads on one or more of their outer surfaces wherein the contact elements serve for electrically contacting the magnetic sensor chips. The contact elements may have any desired form or shape. They can, for example, have the form of lands, i.e., flat contact layers on an outer surface of the semiconductor package. The contact elements or contact pads may be made from any electrically conducting material, e.g., from a metal as aluminum, gold, or copper, for example, or a metal alloy, or an electrically conducting organic material, or an electrically conducting semiconductor material.

In the claims and in the following description different embodiments of a method for fabricating a magnetic sensor device are described as a particular sequence of processes or measures, in particular in the flow diagrams. It is to be noted that the embodiments should not be limited to the particular sequence described. Particular ones or all of the different processes or measures can also be conducted simultaneously or in any other useful and appropriate sequence.

In the following, several embodiments are presented in which a magnetic sensor chip is used and intended for sensing a static or dynamic magnetic field. It is to be noted that the magnetic sensor chip can be constructed in different ways and can work along different measurement principles. The magnetic sensor chip can, for example, comprise a Hall sensor element. Alternatively, the magnetic sensor chip can comprise a magneto resistive (XMR) sensor element. Also other implementations of a magnetic sensor chip can be employed by the skilled person.

Referring to FIG. 1, there is shown a schematic cross-sectional side view representation of a magnetic sensor device according to an embodiment. The magnetic sensor device 10 comprises a magnet 1 configured to generate a bias magnetic field, a plurality of electrical wires 2 one of which is designated as a first electrical wire 2.1. The magnetic sensor device further comprises a magnetic sensor chip 3 attached to an end face 2.1A of a first electrical wire 2.1 of the plurality of electrical wires 2. According to an embodiment, the electrical wires extend through the magnet 1.

According to an embodiment of the magnetic sensor device 10, the electrical wires 2 are fabricated out of a leadframe, in particular of a copper based leadframe. In particular, as will be shown and explained later, at the beginning of a fabrication process the electrical wires 2 can be part of a contiguous major leadframe which contains a plurality of single leadframes with electrical wires 2 and which is singulated during the fabrication process into single leadframes each one comprising one magnetic sensor device.

According to an embodiment of the magnetic sensor device 10, the magnetic sensor chip 3 comprises a Hall sensor element or magneto resistive (XMR) sensor element.

According to an embodiment of the magnetic sensor device 10, the plurality of electrical wires 2 extend through the magnet 1 in such a way that they are completely embedded within the magnet 1 along a particular line section of the electrical wires 2.

According to an embodiment of the magnetic sensor device 10, the magnet 1 can be comprised of a material composition of a polymer and magnetic particles. The material composition can, for example, comprise or consist of an epoxy resin or any other material which can be formed by molding or casting into any desired shape. According to an embodiment, the material composition can be configured such that magnetic particles are coated with a polymer or polymer-based material, in particular with a thermoset polymer material and in particular such that the filling degree of magnetic particles is >>90%. According to an embodiment the material composition can be configured such that a polymer or polymer-based material, in particular a thermoplast material, is filled with magnetic particles, in particular such that the filling degree of magnetic particles is <90%, in particular 80-90%.

According to an embodiment of the magnetic sensor device 10, the device further comprises an encapsulation material encapsulating the magnetic sensor chip 3. Embodiments showing the device with the encapsulation material will be shown and explained later. According to an embodiment thereof, the encapsulation material also covers end faces of the electrical wires 2 other than the first electrical wire 2.1. According to an embodiment, the encapsulation material also covers at least one of the main surfaces of the magnet 1.

According to an embodiment of the magnetic sensor device 10, the end face 2.1A of the first electrical wire 2.1 is situated in a plane which is oriented perpendicular to a longitudinal axis of a portion of the first electrical wire 2 adjacent to the end face 2.1A. The end face 2.1A of the first electrical wire 2.1 can have dimensions larger than cross-sectional dimensions of the first electrical wire 2.1, in particular in such a way that at least along one direction the end face 2.1A is larger than a cross-section of the first electrical wire 2.1. The end face 2.1A can also be equal in dimensions to the cross-sectional dimensions of the first electrical wire 2.1.

According to an embodiment of the magnetic sensor device 10, a main plane of the magnetic sensor chip 3 is oriented perpendicular to a longitudinal axis of a portion of the first electrical wire 2.1 adjacent to the end face 2.1A.

According to an embodiment of the magnetic sensor device 10, the first electrical wire 2.1 comprises an end portion formed so as to provide the end face 2.1A. In particular, the end portion is formed so as to provide the end face comprising a surface area being larger at least along one direction than a cross-sectional area of any other portion of the first electrical wire 2.1. According to an embodiment thereof, the end portion is formed by one or more of forging or bending.

According to an embodiment of the magnetic sensor device 10, the device further comprises the electrical wires 2 being covered by an insulation layer along respective portions within the magnet 1. An embodiment thereof will be shown and explained later. According to an embodiment thereof, the insulation layer may comprise or consist of galvanically deposited zinc-oxide and/or chromium-oxide. According to another embodiment, the insulation layer is comprised of an oxidized surface of the electrical wires itself.

According to an embodiment of the magnetic sensor device 10, the device further comprises one or more capacitors each one of the capacitors connected between two electrical wires 2, respectively, or between a terminal of the magnetic sensor chip 3 and one electrical wire 2, respectively. In particular, the capacitors are configured to provide adequate protection against electrostatic discharge (ESD). In particular, according to an embodiment, the capacitors each comprise capacitance values within a range from 0.5 nF to 100 nF, more specifically 1 nF to 50 nF. Embodiments of a magnetic sensor device comprising such capacitors will be shown and explained later.

According to an embodiment, the magnetic sensor chip 3 can be comprised of a silicon chip or silicon die. However, the magnetic sensor chip 3 can also be comprised of a package as, for example, a PSSO package which encloses the silicon chip or silicon die.

Figure 2:
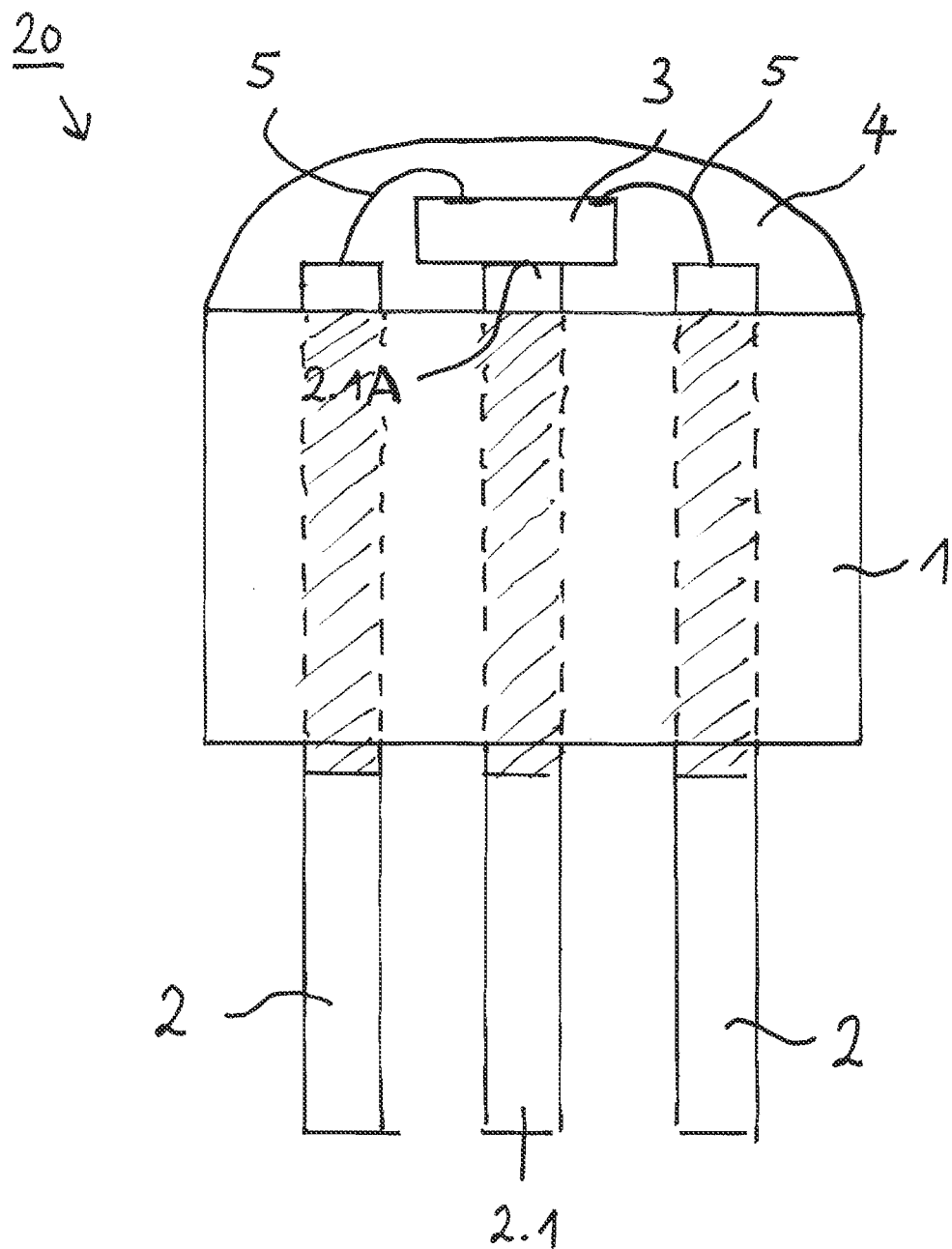
FIG. 2 shows a schematic cross-sectional side view representation of a magnetic sensor device according to an embodiment.

Referring to FIG. 2, there is shown a schematic cross-sectional side view representation of a magnetic sensor device according to an embodiment. The magnetic sensor device 20 comprises a structure which is similar to the magnetic sensor device 10 of FIG. 1. Insofar as the same reference signs as were used in FIG. 1 for the several structural elements are also used in FIG. 2, the description thereof will not be repeated here. In the following only those structural elements of the magnetic sensor device 20 are described which were added to the embodiment of a magnetic sensor device as shown in FIG. 1.

The magnetic sensor device 20 of FIG. 2 further comprises an encapsulation material 4 which encapsulates the magnetic sensor chip 3 and covers end faces of electrical wires 2 other than the first electrical wire 2.1 and an upper surface of the magnet 1. According to an embodiment, the encapsulation material 4 comprises or consists of one or more of a resin material, in particular an epoxy resin material, any sort of a polymer-based material, or any sort of an UV curable material. According to an embodiment, the encapsulation material 4 can, for example, be applied by dip-coating. According to an embodiment, the encapsulation material 4 is applied only to an upper surface of the magnet 1 thereby embedding the magnetic sensor chip 3 and covering the end faces of the electrical wires 2 other than the first electrical wire 2.1 as shown in the embodiment of FIG. 2. However, it is also possible that the encapsulation material 4 also completely encapsulates the magnet 1 according to an embodiment which will be shown and explained later.

According to an embodiment of the magnetic sensor device 20 as shown in FIG. 2, the magnetic sensor chip 3 is attached to the first electrical wire 2.1 and also electrically connected to one or more of the other electrical wires 2 by bond wires 5. The bond wires 5 are also embedded within the encapsulation material 4. This is an embodiment in which the magnetic sensor chip 3 is itself comprised of a silicon chip. If, however, the magnetic sensor chip 3 is comprised of a package, the package may comprise external electrical contact areas and the package may be situated on all three electrical wires 2 thereby making electrical contact between the electrical wires and the electrical contact areas of the package.

According to an embodiment of the magnetic sensor device 20 as shown in FIG. 2, the electrical wires 2 are coated or covered by an electrically insulating material along respective line sections (shown as hatched areas) within the magnet 1 in order to prevent an electrical short-circuit due to a possible electrical conductivity of the magnetic particles of the material composition of the magnet 1. The electrically insulating material can, for example, comprise one or more of zinc-oxide or chromium-oxide which can be galvanically deposited onto the surfaces of the electrical wires 2 along the mentioned line sections. According to another embodiment, the electrically insulating material can be comprised of any electrically insulating polymer-based material like any sort of resin, in particular, epoxy resin, or any sort of dielectric insulating material. According to another embodiment, the electrically insulating material can be provided by an electrically insulating tape material which is wound around the electrical wires 2 along the mentioned line sections within the magnet 1. According to another embodiment, the electrically insulating material can be comprised of an oxidized surface of the electrical wires.

Further embodiments of the magnetic sensor device 20 of FIG. 2 can be formed together with any one of the features and embodiments as described above in connection with the magnetic sensor device 10 of FIG. 1.

Figure 3A:
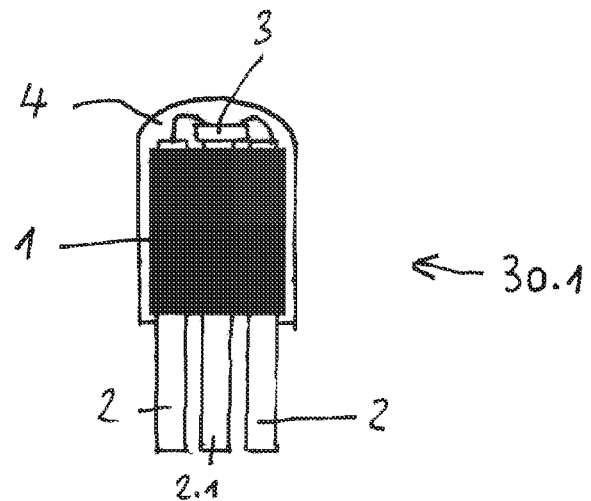
FIGS. 3A-3C show schematic cross-sectional side view representations of magnetic sensor devices according to embodiments.
Figure 3B:
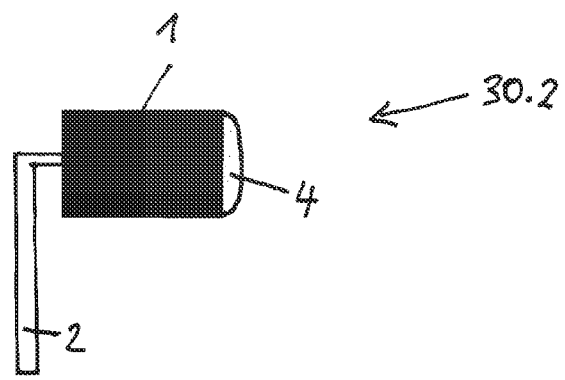
Figure 3C:
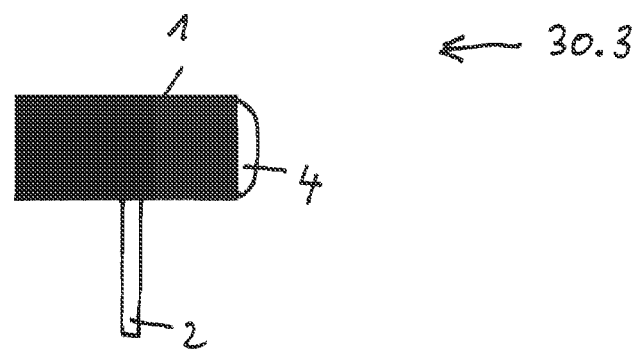

Referring to FIGS. 3A-3C, there are shown schematic cross-sectional side view representations of further embodiments of magnetic sensor devices. Again only additions and alterations as compared to the magnetic sensor devices shown in FIGS. 1 and 2, will be outlined in the following. FIG. 3A shows a magnetic sensor device 30.1 in which, as compared with the magnetic sensor device 20 of FIG. 2, the encapsulation material 4 is disposed in such a way that the whole magnet 1 together with the magnetic sensor chip 3 and the upper end faces of the electrical wires 2 are embedded within the encapsulation material 4. FIG. 3B shows a magnetic sensor device 30.2 having electrical wires 2 bent in a right corner at a position just before they penetrate into the magnet 1. The electrical wires 2 are shown in a side view on a row of the electrical wires 2 so that only one of the electrical wires 2 is to be seen. FIG. 3C shows a magnetic sensor device 30.3 in which the electrical wires 2 penetrate the magnet 1 from a side wall so that the electrical wires 2 are bent inside the magnet 1 in a right angle towards the magnetic sensor chip 3 and the encapsulation material 4.

Figure 4C:
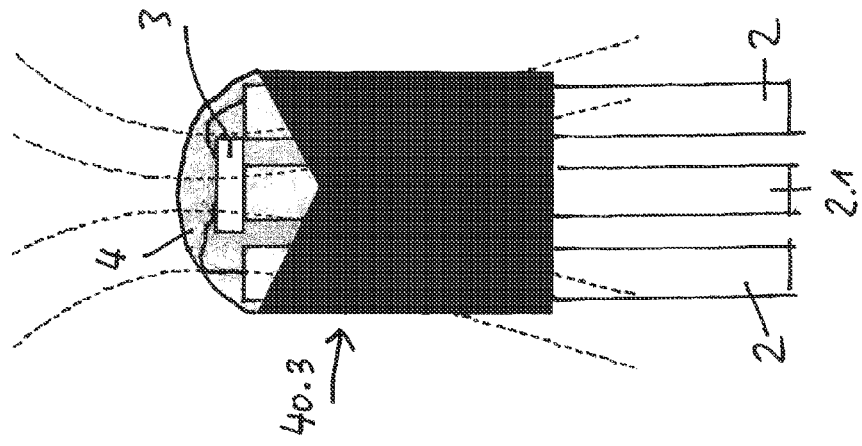
FIGS. 4A-4C show schematic cross-sectional side view representations of magnetic sensor devices according to embodiments.
Figure 4B:
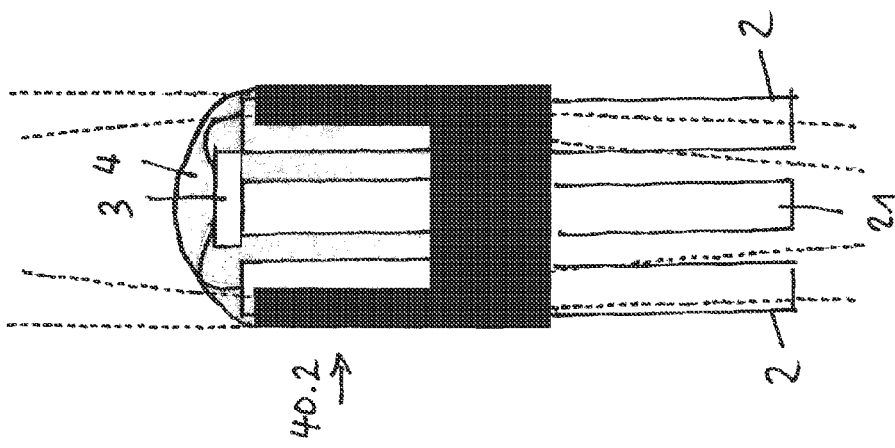
Figure 4A:
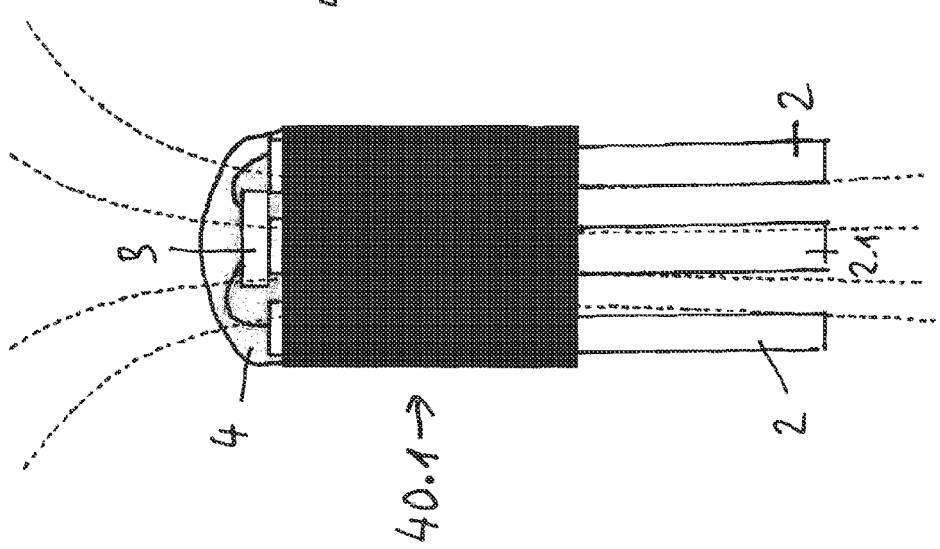

FIGS. 4A-4C show schematic cross-sectional side view representations of further embodiments of magnetic sensor devices. These further embodiments are intended to illustrate the various possibilities of shaping the permanent magnetic field generated by the magnet 1. FIG. 4A shows a magnetic sensor device 40.1 formed in the same way as the magnetic sensor device 20 of FIG. 2. In addition the dotted lines show the field lines of the magnetic field generated by the magnet 1. The magnet 1 has the shape of a cuboid having a rectangular cross-section with side faces a and b and a height c which is perpendicular to the plane of the sheet. FIG. 4B shows a magnetic sensor device 40.2 in which the magnet 1 is in principle formed in the same manner as in FIG. 4A but wherein a depression having a rectangular cross-section is formed from the upper surface into the magnet 1 so that in this region only side walls of the magnet 1 remain. It can be seen that the field lines of the magnetic field are significantly different as compared with FIG. 4. In particular the field lines diverge in case of FIG. 4A and are more less convergent in case of FIG. 4B. FIG. 4C shows a magnetic sensor device 40.3 in which the magnet 1 is also formed in principle in the same way as in FIG. 4A but wherein a depression is formed from the upper surface into the magnet 1, the depression having a triangular cross-section. Again it can be seen that the field lines of the magnetic field are different from those of the embodiments of FIGS. 4A and 4B.

Referring to FIGS. 5A-5C there are shown schematic cross-sectional side view representations of further embodiments of magnetic sensor devices. These further embodiments are intended to show how electro-static discharge (ESD) can be efficiently prevented within a magnetic sensor device. Again only additions and alterations, as compared with the magnetic sensor device 20 in FIG. 2, are explained in the following. FIG. 5A shows a magnetic sensor device 50.1 comprising two capacitors 6, each one connected between two electrical wires 2. The capacitors 6 can, for example, be comprised of ceramic capacitors such as those of type X8R known by the skilled person. These sorts of capacitors are typically constructed as SMD (Surface Mounted Device) devices which can, for example, be mounted to the electrical wires 2 by means of an electrically conductive adhesive. The capacitance values of the capacitors 6 are typically in a range from 0.5 nF and 100 nF, more specifically 1 nF-50 nF. As shown in FIG. 5A, one of the two capacitors 6 is connected between the first electrical wire 2.1 and the left-sided electrical wire 2 and the second one of the capacitors 6 is connected between the first electrical wire 2.1 the right-sided electrical wire 2. The capacitors 6 are connected to the electrical wires 2 so that the magnet 1 is situated between the magnetic sensor chip 3 and the capacitors 6. FIG. 5B shows a magnetic sensor device 50.2 which is similar to the embodiment of FIG. 5A but wherein, however, the capacitors 6 are connected to the electrical wires 2 at a position so that they are situated between the magnet 1 and the magnetic sensor chip 3. The capacitors 6 are thus also covered by the encapsulation material 4. FIG. 5C shows a magnetic sensor device 50.3 in which the capacitors 6 are each one connected between an electrical terminal of the magnetic sensor chip 3 and one of the left-sided or right-sided electrical wires 2. Each one of the capacitors 6 is also attached on an upper surface of one of the left-sided or right-sided electrical wires 2.

Figure 6:
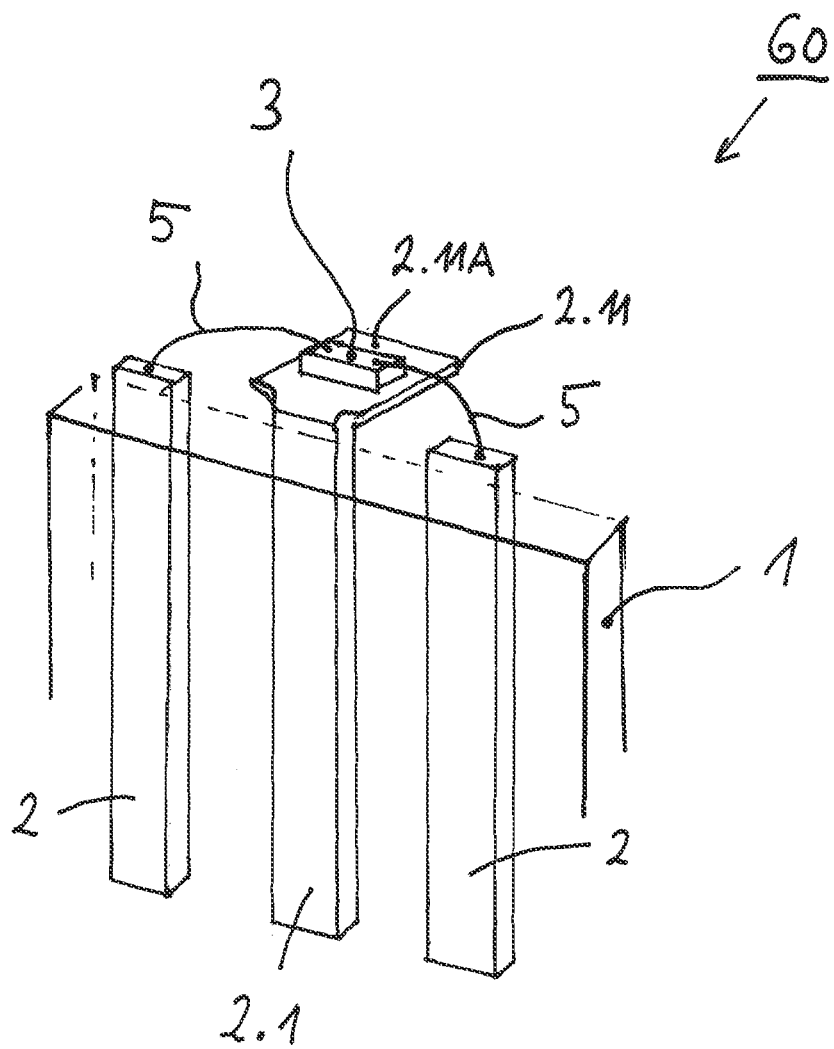
FIG. 6 shows a schematic perspective representation of a magnetic sensor device according to an embodiment.

Referring to FIG. 6, there is shown a perspective representation of a magnetic sensor device according to an embodiment. The magnetic sensor device 60 of FIG. 6 comprises a first electrical wire 2.1 and further electrical wires 2. The first electrical wire 2.1 comprises an end portion 2.11 which is formed by bending as will be shown later. The end portion 2.11 comprises an upper flat surface 2.11A on which a magnetic sensor chip 3 is mounted. The upper surface 2.11A of the end portion 2.11 comprises a surface area which is sufficiently large so that the magnetic sensor chip 3 can be safely placed there upon, which means that in practice the surface area of the surface 2.11A is slightly larger than the lower surface of the magnetic sensor chip 3. The magnetic sensor chip 3 comprises at its upper surface electrical contact pads each of which is connected by means of a bond wire 5 with one of the other electrical wires 2.

Figure 7:
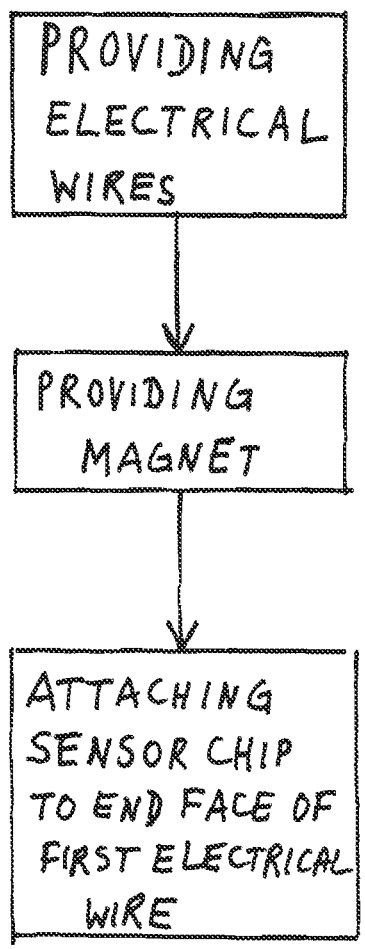
FIG. 7 shows a flow diagram for illustrating a method for fabricating a magnetic sensor device according to an embodiment.

Referring to FIG. 7, there is shown a flow diagram for illustrating a method for fabricating a magnetic sensor device according to an embodiment. The method 70 of FIG. 7 comprises providing a plurality of electrical wires (71), providing a magnet so that the electrical wires extend through the magnet (72), and attaching a sensor chip to an end face of a first electrical wire of the plurality of electrical wires (73).

According to an embodiment of the method 70, providing a magnet comprises attaching or molding a material composition of a polymer and magnetic or magnetizable particles on or around the electrical wires. In particular, along a pre-determined line section of the parallel electrical wires, the material composition is molded in such a way to the electrical wires that the electrical wires are completely embedded within the material composition along the pre-determined line sections of the wires. Thereafter, in a step of magnetization, the magnetizable particles of the material composition, can be magnetized by means known in the art.

According to an embodiment of the method 70, the method further comprises encapsulating the magnetic sensor chip with an encapsulation material. According to an embodiment thereof, encapsulating with an encapsulation material can be performed by dipping the arrangement containing the magnetic sensor chip into a bath containing the encapsulation material in a liquid form. According to an embodiment, the encapsulation material can be made of an UV curable material so that in a following step the encapsulation material is exposed to UV radiation in order to be cured.

According to an embodiment of the method 70 of FIG. 7, providing a plurality of electrical wires comprises providing a first electrical wire in such a way that the first electrical wire comprises an end portion which is different from end portions of the other electrical wires. The end portion of the first electrical wire comprises the end face to attach the magnetic sensor chip thereupon. During fabricating of the magnetic sensor device the end portion is bent out of a common plane of the electrical wires until its end face stands in a right angle thereto. This will be shown and explained in further detail later.

According to an embodiment of the method 70 of FIG. 7, the plurality of electrical wires is provided in the form of a leadframe.

According to an embodiment of the method 70, the magnetic sensor chip is attached to an end face of at least one of the electrical wires.

Further embodiments of the method 70 of FIG. 7 can be formed with any one of the features or embodiments as were described above in connection with the embodiments of FIGS. 1 to 6.

Figure 8:
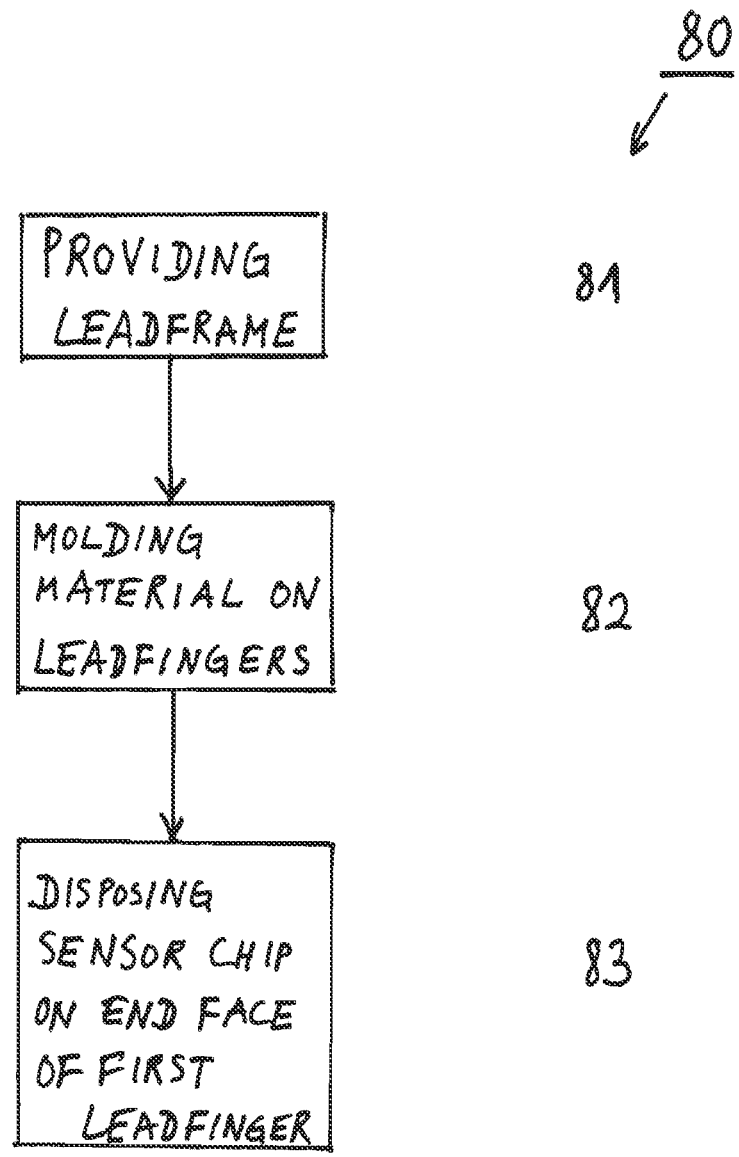
FIG. 8 shows a flow diagram for illustrating a method for fabricating a magnetic sensor device according to an embodiment.

Referring to FIG. 8, there is shown a flow diagram for illustrating a method for fabricating a magnetic sensor device according to an embodiment. The method 80 comprises providing a leadframe comprising a plurality of leadfingers (81), molding a polymer-based material containing magnetic or magnetizable particles on or around the leadfingers so that the leadfingers extend through the molded polymer-based material (82), and disposing a sensor chip to an end face of a first leadfinger of the plurality of leadfingers (83).

According to an embodiment of the method 80 of FIG. 8, the method further comprises encapsulating the magnetic sensor chip with an encapsulation material. According to a further embodiment thereof, the method further comprises covering end faces of the leadfingers with the encapsulation material. Further embodiments thereof have been described above in connection with FIG. 7.

According to an embodiment of the method 80, the magnetic sensor chip is attached to an end face of at least one of the leadfingers.

In general further embodiments of the method of FIG. 8 can be formed with any feature or embodiment as described above in connection with FIG. 7.

Figures 9A, 9B, 9C, 9D:
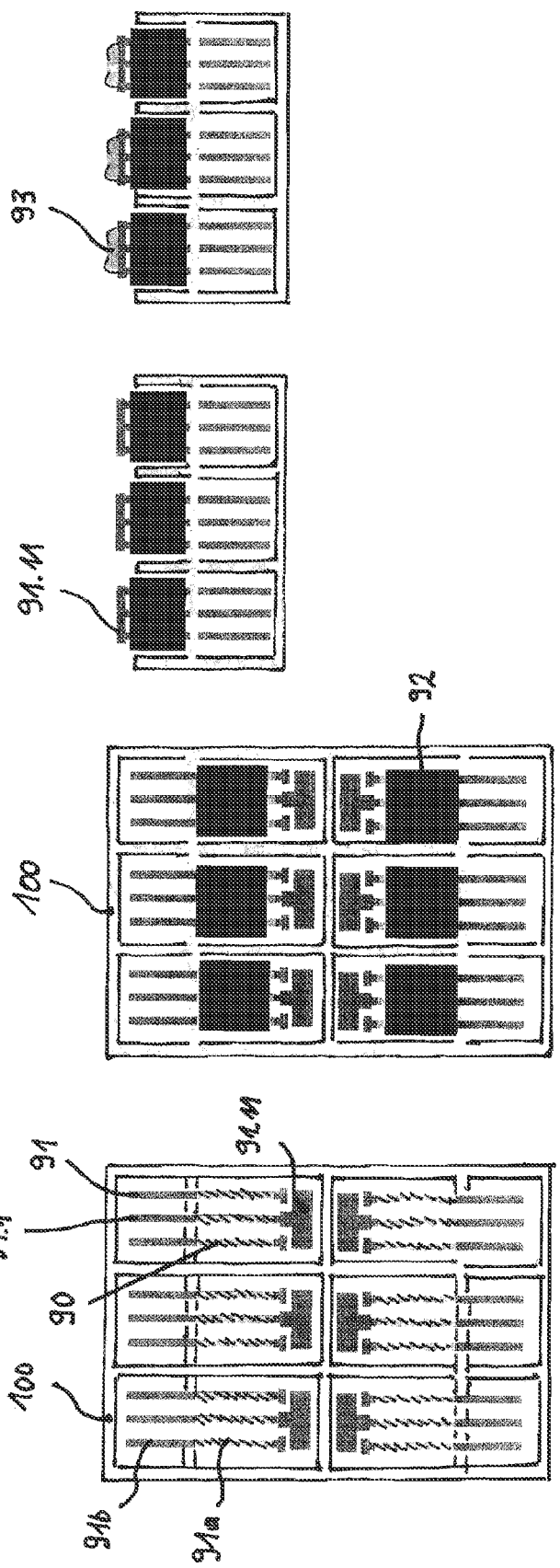
FIGS. 9A-9G show schematic top view and side view representations for illustrating a method for fabricating a magnetic sensor device according to an embodiment.

Referring to FIGS. 9A-9G, there are shown schematic top view and side view representations for illustrating a method for fabricating a magnetic sensor device. FIG. 9A shows a top view representation of a major leadframe 100 which is subdivided into six sections each containing a single leadframe intended to become one magnetic sensor device. The single leadframes 90 are formed identical and comprise electrical wires 91 and among them a first electrical wire 91.1, which is intended to support a magnetic sensor chip later. The first electrical wire 91.1 comprises an end portion 91.11 which is intended to serve as a substrate for supporting the magnetic sensor chip. The single leadframes 90 are mounted within the major leadframe 100 in such a way that the electrical wires 91 are each divided into two parts, wherein one part, which is designated with the reference number 91a (hatched), is provided with an insulation layer and the other part, which is designated with reference number 91b, is left untreated. The insulation layer can be fabricated as described above.

FIG. 9B shows the same arrangement after compression molding of a material composition 92, in particular an epoxy coated magnet material, essentially onto the portions 91a of each one of the single leadframes 90. The material composition 92 comprises magnetizable particles embedded therein which are intended to be magnetized in a later step of the fabrication method. The compression molding can be performed by any standard process known by the skilled person.

FIG. 9C shows a side view representation of one half of the major leadframe as shown in FIG. 9B after bending down the end portion 91.11 of each one of the first electrical wires 91.1 of the single leadframes 90. Details of this process are shown in further detail in FIGS. 10A-10E. FIG. 10A shows a side view onto one row of single leadframes 90 of FIG. 9B. FIG. 10B shows the arrangement after attaching a specific tool 95 to the material compositions 92 of the single leadframes 90 by clamping it between their respective upper and lower surfaces wherein the broken curved arrow shows the direction of bending of the end portions 91.11. FIG. 10C shows the arrangement after bending the end portions 91.11 so that they come to rest on an upper surface of the tool 95. FIG. 10D shows the arrangement after attaching magnetic sensor chips 93 onto the respective end faces 91.11A of the single leadframes 90 and electrically connecting the chips 93 by bond wires 96. FIG. 10E shows the arrangement after removing of the tool 95.

FIG. 9D shows the arrangement of FIG. 10E in a representation showing all three leadframes still connected with each other. The magnetic sensor chips 93 are electrically connected to the left and right electrical wires 91 by bonds wires 96. At this stage also ESD capacitors can be connected between the magnetic sensor chips 93 and the left and right electrical wires 91 as described above.

Figure 9G:
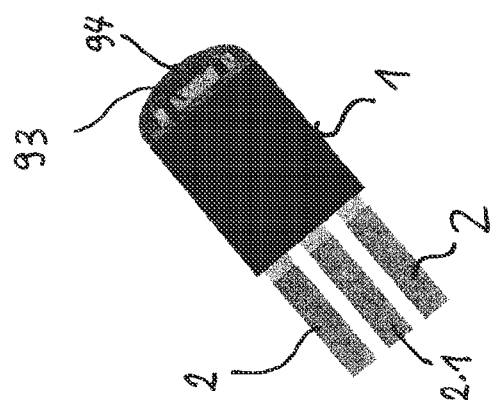
Figure 9F:
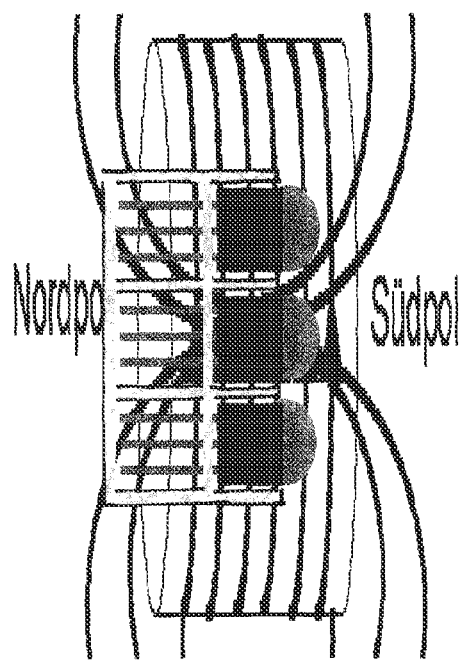
Figure 9E:
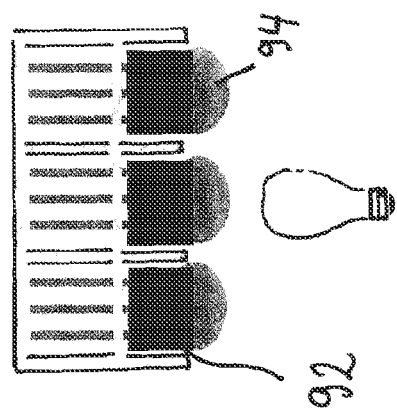

FIG. 9E shows the arrangement of FIG. 9D in an upside-down configuration after dipping the arrangement into a resin bath in order to encapsulate the magnetic sensor chips 93 with an encapsulation material 94 consisting of an epoxy resin. Thereafter the encapsulation material is exposed to UV radiation in order to be cured (symbolized by the light bulb).

FIG. 9F illustrates the application of an external magnetic field in order to magnetize the magnetizable particles embedded in the material composition 92.

FIG. 9G shows a magnetic sensor device after singulation of the arrangement as shown in FIG. 9E into three separate magnetic sensor devices.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A magnetic sensor device comprising:
a magnet configured to generate a bias magnetic field;
a plurality of electrical wires; and
a magnetic sensor chip,
wherein a first electrical wire of the plurality of electrical wires has an end portion which is bent, the end portion having a flat surface with a surface area larger than a surface area of a lower surface of the magnetic sensor chip, the magnetic sensor chip being mounted with its lower surface on the surface area of the end portion.

2. The magnetic sensor device according to claim 1, wherein the magnet comprises a material composition of a polymer and magnetic particles.

3. The magnetic sensor device according to claim 1, further comprising an encapsulation material encapsulating the magnetic sensor chip.

4. The magnetic sensor device according to claim 3, wherein the encapsulation material also covers end portions of the electrical wires.

5. The magnetic sensor device according to claim 1, wherein the end portion of the first electrical wire is oriented perpendicular to a longitudinal axis of a portion of the first electrical wire adjacent to the end portion.

6. The magnetic sensor device according to claim 1, wherein a main plane of the magnetic sensor chip is oriented perpendicular to a longitudinal axis of a portion of the first electrical wire adjacent to the end portion.

7. The magnetic sensor device according to claim 1, wherein the surface area of the end portion of the electrical wire is larger at least along one direction than a cross-sectional area of any other portion of the first electrical wire.

8. The magnetic sensor device according to claim 7, wherein the end portion is formed by forging and/or bending.

9. The magnetic sensor device according to claim 1, further comprising one or more capacitors, each capacitor connected between two electrical wires or between the magnetic sensor chip and one electrical wire, respectively.

10. A magnetic sensor device comprising:
a plurality of electrical wires;
a permanent magnet; and
a magnetic sensor chip,
wherein a first electrical wire of the plurality of electrical wires has an end portion which is bent, the end portion having a flat surface with a surface area larger than a surface area of a lower surface of the magnetic sensor chip, the magnetic sensor chip being mounted with its lower surface on the surface area of the end portion.

11. The magnetic sensor device according to claim 10, wherein a plane of the magnetic sensor chip is oriented perpendicular to a portion of the first electrical wire adjacent to the end portion.

12. The magnetic sensor device according to claim 10, wherein the magnet comprises a material composition of a polymer and magnetic particles.

13. A magnetic sensor device comprising:
a leadframe comprising leadfingers;
a magnetic sensor chip; and
a magnet configured to generate a bias magnetic field,
wherein a first leadfinger of the leadfingers has an end portion which is bent, the end portion having a flat surface with a surface area larger than a surface area of the magnetic sensor chip, the magnetic sensor chip being mounted with its lower surface on the surface area of the end portion.

14. The magnetic sensor device according to claim 13, further comprising an encapsulation material encapsulating the magnetic sensor chip.

15. The magnetic sensor device according to claim 14, wherein the encapsulation material also covers end portions of the leadfingers other than the first leadfinger.

16. The magnetic sensor device according to claim 13, wherein the magnet comprises a material composition of a polymer and magnetic particles.

17. A method for fabricating a magnetic sensor device, the method comprising:
providing a plurality of electrical wires, wherein a first electrical wire of the plurality of electrical wires having an end portion which is bent, the end portion having a flat surface with a surface area larger than a surface area of a lower surface of a magnetic sensor chip;
providing a magnet so that the electrical wires extend through the magnet; and
mounting the magnetic sensor chip with the lower surface on the surface area of the end portion.

18. The method according to claim 17, wherein providing the magnet comprises attaching a material composition of a polymer and magnetic or magnetizable particles on or around the electrical wires.

19. The method according to claim 17, further comprising encapsulating the magnetic sensor chip with an encapsulation material.

20. A method for fabricating a magnetic sensor device, the method comprising:
providing a leadframe comprising a plurality of leadfingers, wherein a first leadfinger of the plurality of leadfingers has an end portion which is bent, the end portion having a flat surface with a surface area larger than a surface area of a lower surface of a magnetic sensor chip;
molding a material composition of a polymer and magnetic or magnetizable particles on or around the leadfingers so that the leadfingers extend through the molded polymer-based material; and mounting the magnetic sensor chip with the lower surface on the surface area of the end portion.

21. The method according to claim 20, further comprising encapsulating the magnetic sensor chip with an encapsulation material.

22. The method according to claim 21, wherein encapsulating the sensor magnetic chip comprises covering end portions of the leadfingers other than the first leadfinger with the encapsulation material.

\* \* \* \* \*

UNITED STATES PATENT AND TRADEMARK OFFICE
CERTIFICATE OF CORRECTION

PATENT NO. : 9,121,880 B2
APPLICATION NO. : 13/289629
DATED : September 1, 2015
INVENTOR(S) : Klaus Elian It is certified that error appears in the above-identified patent and that said Letters Patent is hereby corrected as shown below:

In the claims,

In Col. 9, line 61, claim 7, delete "portion of the electrical" and insert --portion of the first electrical--.

In Col. 10, line 26, claim 13, delete "surface area larger than a surface area of the" and insert --surface area larger than a surface area of a lower surface of the--.

In Col. 11, line 7, claim 22, delete "the sensor magnetic chip" and insert --the magnetic sensor chip--.

Signed and Sealed this
First Day of March, 2016

Michelle K. Lee
*Director of the United States Patent and Trademark Office*